United States Patent
Haruhana et al.

(10) Patent No.: US 6,445,071 B1
(45) Date of Patent: Sep. 3, 2002

(54) SEMICONDUCTOR DEVICE HAVING AN IMPROVED MULTI-LAYER INTERCONNECTION STRUCTURE AND MANUFACTURING METHOD THEREOF

(75) Inventors: Hideyo Haruhana; Hiroyuki Amishiro; Akihiko Harada, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/488,781

(22) Filed: Jan. 21, 2000

(30) Foreign Application Priority Data

Jul. 12, 1999 (JP) .......................................... 11-197904

(51) Int. Cl.[7] .......................... H01L 23/48; H01L 23/52; H01L 29/40
(52) U.S. Cl. ......................... 257/758; 257/750; 257/762; 257/774
(58) Field of Search ................................. 257/750, 753, 257/754–766, 768–770, 774–776

(56) References Cited

U.S. PATENT DOCUMENTS

| | | | |
|---|---|---|---|
| 5,512,514 A | * 4/1996 | Lee | ........................... 438/626 |
| 5,578,861 A | * 11/1996 | Kinoshita et al. | ........... 257/529 |
| 5,834,845 A | * 11/1998 | Stolmeijer | ................... 257/752 |
| 5,886,410 A | * 3/1999 | Chiang et al. | .............. 257/759 |
| 5,990,507 A | * 11/1999 | Mochizuki et al. | ......... 257/295 |
| 6,018,195 A | * 1/2000 | Takebuchi | ................... 257/752 |
| 6,071,809 A | * 6/2000 | Zhao | ........................... 438/634 |

FOREIGN PATENT DOCUMENTS

| JP | 06125180 A | * 5/1994 |
|---|---|---|
| JP | 10-289984 | 10/1998 |

\* cited by examiner

Primary Examiner—Eddie Lee
Assistant Examiner—Chris C Chu
(74) Attorney, Agent, or Firm—McDermott, Will & Emery

(57) ABSTRACT

A semiconductor device, having a multi-layer interconnection structure, is provided which comprises a semiconductor substrate and a plurality of interlayer insulating films formed on the semiconductor substrate. A plurality of conductive leads are formed in the interlayer insulating films. In one of the interlayer insulting films having conductive lead or leads, at least one conductive plug is formed vertically to connect the conductive leads in different interlayer insulating films. Further, adjacent conductive leads may be formed in an adjacent interlayer insulating films are connected together to form a unified conductive lead.

6 Claims, 4 Drawing Sheets

SEMICONDUCTOR DEVICE HAVING AN IMPROVED MULTI-LAYER INTERCONNECTION STRUCTURE AND MANUFACTURING METHOD THEREOF

BACKGROUND OF THE INVENTION

1. Field of the Invention

The present invention relates to a semiconductor device having a multi-layer interconnection structure, and a method of manufacturing such a device by using a damascene process.

2. Background Art

In a conventional semiconductor device having a multi-layer interconnection structure, a plurality of $SiO_2$-based interlayer insulating films are laminated on a semiconductor substrate carrying integrated circuits formed thereon, and conductive leads or interconnections are formed in each interlayer insulating film or across the interlayer insulating films. In this case, vertical connections between the conductive leads in different interlayer insulating films are made by forming a through-hole in an interlayer insulating film between the two conductive leads, forming a plug by filling the through-hole with a metal, and connecting the both ends of the plug to the conductive leads above and underneath the plug.

Since conventional semiconductor devices are manufactured as described above, no conductive leads can be formed in the interlayer insulating film haven a through-hole and a plug, and the conductive leads are formed in the interlayer insulating films above and underneath the through-hole.

Therefore, the multi-layer interconnection structure is thickened, and the wafer is warped by the stress of the interlayer insulating films or the like, arising problems of erroneous sucking of wafers during the wafer processing, or defocusing during photoengraving.

SUMMARY OF THE INVENTION

The present invention is conceived in order to solve such problems, and the object of the present invention is to provide a semiconductor device having a multi-layer interconnection structure which realizes thinner interconnecting structure, reduces the area required for interconnection, lowers interconnection capacity, and forms a capacity element without voltage dependency. Further object of the present invention is to provide a method for forming an increased number of conductive leads or interconnections by using fewer process steps.

According to one aspect of the present invention, a semiconductor device, having a multi-layer interconnection structure, comprises a semiconductor substrate and a plurality of interlayer insulating films formed on the semiconductor substrate. A plurality of conductive leads are formed in the interlayer insulating films. Further, at least one conductive plug is formed in at least one of the interlayer insulating films having at least one conductive lead, and the conductive plug connects at least a pair of conductive leads in the different interlayer insulating films.

According to another aspect of the present invention, a semiconductor device, having a multi-layer interconnection structure, comprises a semiconductor substrate and a plurality of interlayer insulating films formed on the semiconductor substrate. A plurality of conductive leads are formed in the interlayer insulating films. Further, at least a pair of adjacent conductive leads, which are formed in an adjacent interlayer insulating films, are connected together to form a unified thick conductive lead.

According to another aspect of the present invention, a semiconductor device, having a multi-layer interconnection structure, comprises a semiconductor substrate and a plurality of interlayer insulating films formed on the semiconductor substrate. At least a dielectric film is formed between the adjacent interlayer insulating films. A plurality of conductive leads are formed in the interlayer insulating films. Further, at least a pair of conductive leads are formed in the interlayer insulating films adjacent to the dielectric film, and the pair of conductive leads are formed at opposite position to form a capacity element.

According to another aspect of the present invention, in a method of manufacturing a semiconductor device having a multi-layer interconnection structure, a conductive lead and a conductive plug connecting a pair of other conductive leads in the different interlayer insulating film are formed in one of the interlayer insulating films.

According to still another aspect of the present invention, in a method of manufacturing a semiconductor device having a multi-layer interconnection structure, one conductive lead is formed in an interlayer insulating film, and the other conductive lead is formed above the one conductive leads in an upper adjacent inter layer insulating film, and the two conductive leads are joined together to form a thick unified conductive lead.

According to further aspect of the present invention, in a method of manufacturing a semiconductor device having a multi-layer interconnection structure, a dielectric film is formed between a pair of interlayer insulating film, and a pair of conductive leads are formed in the interlayer insulating films to sandwich the dielectric film to form a capacitor element.

Other and further objects, features and advantages of the invention will appear more fully from the following description.

DETAILED DESCRIPTION OF THE EMBODIMENTS

First Embodiment

Figure 1:
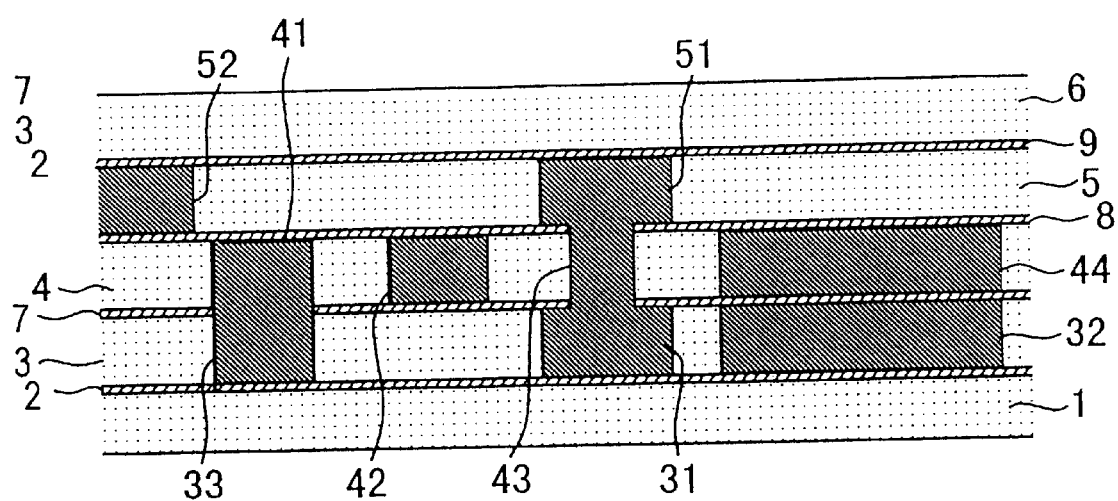
FIG. 1 shows a sectional view of a multi-layer interconnection structure in a semiconductor device according to a First Embodiment of the present invention.

A First Embodiment of the present invention will be described below referring to the drawings. FIG. 1 is a sectional view showing a configuration of a multi-layer interconnection in a semiconductor device according to a First Embodiment of the present invention. This embodiment shows multi-layer interconnection formed by laminating five interlayer insulating films, and shows only a multi-layer interconnected device portion by omitting a semiconductor substrate carrying an integrated circuit formed thereon.

In this drawing, reference numeral 1 is a first $SiO_2$-based interlayer insulating film, 2 is a first dielectric film (first insulation film) formed on the upper surface of the first interlayer insulating film, which is formed of a material having an etching selectivity against the first interlayer insulating film 1, such as silicon nitride. Reference numerals 3–6 are second to fifth interlayer insulating films formed of the same material as the first interlayer insulating film 1, respectively. Reference numerals 7–9 are second to fourth dielectric films (second to fourth insulation films) formed of the same material as the first dielectric film 2 and formed between the interlayer insulating films, respectively. Numeral 31 is a first metal film buried in the second interlayer insulating film 3 and works as interconnection or conductive lead, 32 is a second metal film similarly buried in the second interlayer insulating film 3 and configuring one of the electrodes of the capacity element, 33 is a third metal film similarly buried in the second interlayer insulating film 3 and configuring the other interconnection. Numeral 41 is a fourth metal film buried in the area corresponding to the third metal film 33 in the third interlayer insulating film 4, which is linked to the third metal film 33 by removing the second dielectric film 7 between the fourth metal film 41 and the third metal film 33 to form a thick interconnection.

Numeral 42 is a fifth metal film buried in the third interlayer insulating film 4 in an area not corresponding to any metal film, and configuring another interconnection. Numeral 43 is a sixth metal film buried in the third interlayer insulating film 4 in an area corresponding to the first metal film 31, and is connected to the first metal film 31 by removing the second dielectric film 7 between the sixth metal film 43 and the first metal film 31 to form a plug between the first metal film 31 and the eighth metal film to be described later.

Numeral 44 is a seventh metal film buried in the third interlayer insulating film 4 in an area corresponding to the second metal film 32, and works as the other electrode of the capacity element formed between the seventh metal film 44 and the second metal film 32 via the second dielectric film 7. Numeral 51 is an eighth metal film buried in the fourth interlayer insulating film 5 in an area corresponding to the sixth metal film 43, and works as another conductive lead or interconnection, and is linked to the sixth metal film 43 by removing the third dielectric film 8 present between the eighth metal film 51 and the sixth metal film 43, thus configuring a plug. Numeral 52 is a ninth metal film buried in the fourth interlayer insulating film 5, and works as another interconnection.

Although FIG. 1 shows various elements provided in an interconnected device portion collectively for the ease of description, it will be needless to say that only required elements are incorporated in an actual interconnected device depending on the circuit configuration of each device. In an interconnected device of circuit configuration requiring a capacity element, the second metal film 32 and the seventh metal film 44 configuring the capacity element are formed in required places.

This First Embodiment features that the sixth metal film 43 configuring the plug and the fourth metal film 41 or the fifth 42 configuring other interconnections or conductive paths are formed in the same third interlayer insulating film 4.

The method for manufacturing the interconnected device will be described later.

Since The First Embodiment has the above-described configuration, the thickness of the entire interconnected device portion can be decreased in comparison with a conventional configuration having the same number of interconnections.

Therefore, the warp of wafers can be minimized, and erroneous sucking of wafers during wafer processing and defocusing during photoengraving can be prevented.

The first through fourth dielectric films 2, 7, 8, 9 may be formed partially. Still, the same effect can be attained.
Second Embodiment Next, a Second Embodiment of the present invention will be described below referring to the drawings.

This Second Embodiment features that a thick interconnection bridging across the second interlayer insulating film 3 and the third interlayer insulating film 4 is formed, by the third metal film 33 and the fourth metal film 41 connected therebetween as shown in FIG. 1. In other words, an interconnection having a large cross section may be formed with thin horizontal width and thick vertical height. By such a configuration, the area occupied by interconnections can be minimized.

Also in this embodiment, the first through fourth dielectric films 2, 7, 8, 9 may be formed partially where needed. Still, the same effect can be attained.
Third Embodiment Next, a Third Embodiment of the present invention will be described below referring to the drawings.

This Third Embodiment features that a capacity element is formed by the second metal film 32, the seventh metal film 44, and the second dielectric film 7 placed therebetween as shown in FIG. 1. The electrodes are formed by metal films.

The capacity element of such a configuration has the feature that there is no voltage dependency as compared with a conventional capacity element in which electrodes are form by impurity doped silicon or the like.
Fourth Embodiment Next, a Fourth Embodiment of the present invention will be described below referring to drawings. FIGS. 2–9 show cross sectional views illustrating a method of manufacturing an interconnected device portion of a semiconductor device according to the fourth embodiment.

Figure 2:
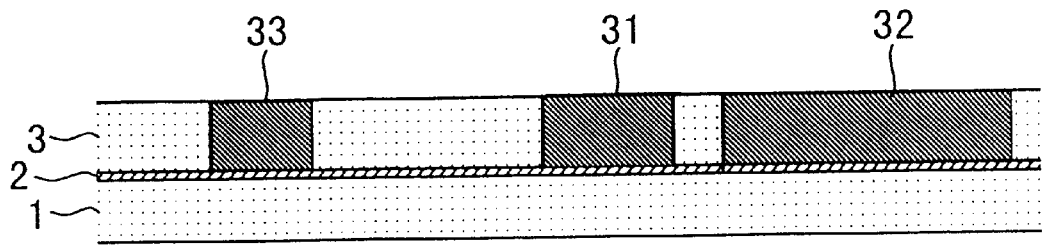
FIGS. 2–9 show cross sectional views illustrating a method of manufacturing an interconnected device portion of a semiconductor device according to the fourth embodiment.

First, as shown in FIG. 2, a first $SiO_2$-based interlayer insulating film 1, a first dielectric film 2, and a second $SiO_2$-based interlayer insulating film 3 are formed. Then, a first metal film 31, a second metal film 32, and a third metal film 33 are formed in the second interlayer insulating film 3 through a damascene process.

Figure 3:
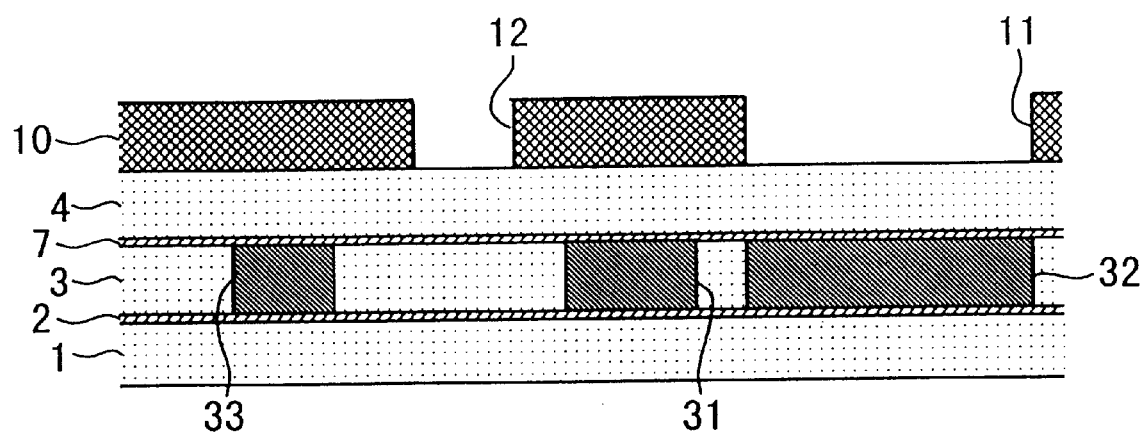

Next, as shown in FIG. 3, a second dielectric film 7, which is comprised of a material having an etch selectivity to the second interlayer insulating film 3, such as silicon nitride, is formed on metal films 31, 32, and 33, and further the third $SiO_2$-based film 4 is deposited on the second dielectric film 7. Thereafter, a first photoresist film 10 is formed on the third interlayer insulating film 4, and openings 11, 12 are formed at an area corresponding to the second metal film 32 and an area corresponding to a fifth metal film 42 which is to be formed in the third interlayer film 4 as shown in FIG. 1, respectively.

Figure 4:
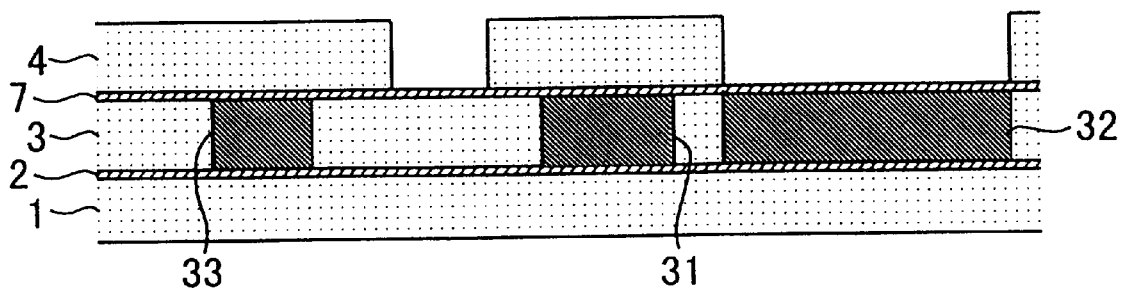

Next, as shown in FIG. 4, the third interlayer insulating film 4 is etched using the first photoresist film 10 as a mask. The etching in this case is anisotropic etching whose etching rate for the third interlayer insulating film 4 is seven times or more that for the second dielectric film 7 in the etched area in a 100 $\mu$m×100 $\mu$m pattern using the second dielectric film 7 as an etching stopper.

Figure 5:
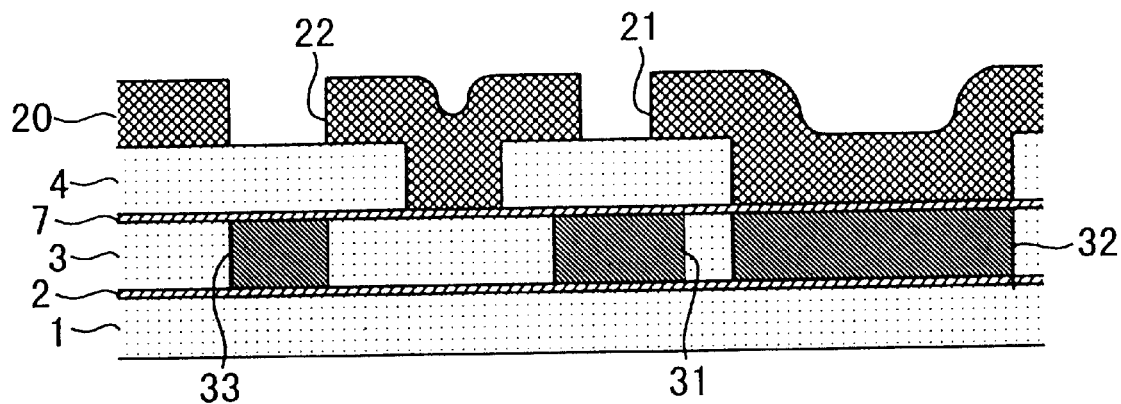

Next, as shown in FIG. 5, a second photoresist film 20 is formed on the third interlayer insulating film 4 including the etched area of the third interlayer insulating film 4. Then, openings 21, 22 are formed in the second photoresist 20 at areas corresponding to the first metal film 31 and the third metal film 33, respectively.

Figure 6:
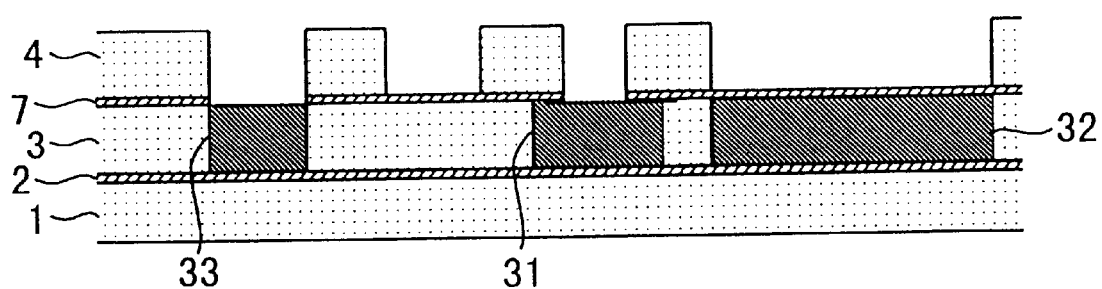
Figure 7:
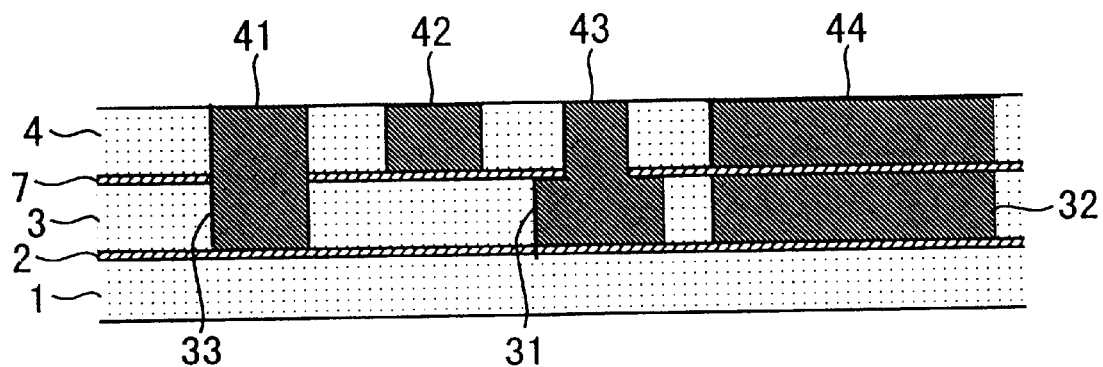

Next, as shown in FIG. 6, the third interlayer insulating film 4 and the second dielectric film 7 are etched by anisotropic etching of the same type as explained in FIG. 4 using the second photoresist film 20 as a mask. Thereafter, a metal film is buried in the etched area of the third interlayer insulating film 4 to form the configuration as shown in FIG. 7.

Here, the fourth metal film 41 forms a thick interconnection together with the third metal film 33. The fifth metal film 42 forms another interconnection. The sixth metal film 43 forms a plug for the first metal film 31, and the seventh metal film 44 forms a capacity element in cooperation with the second metal film 32, in the same way as shown in FIG. 1.

Figure 8:
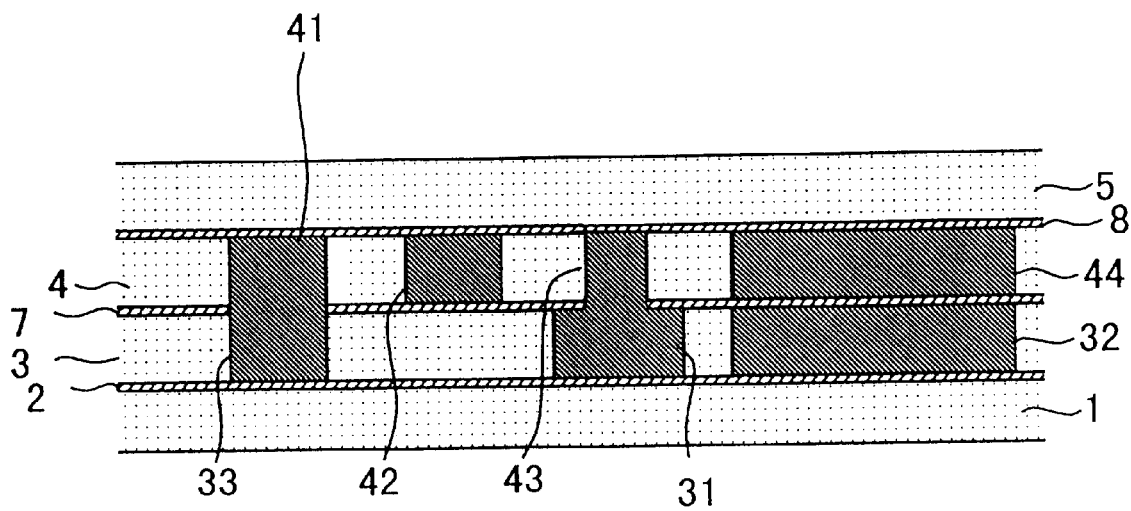

Next as shown in FIG. 8, a third dielectric film 8 is formed on the third interlayer insulating film 4 including metal films 41, 42, and 43, and the fourth $SiO_2$-based film 5 is deposited on the third dielectric film 8.

Figure 9:
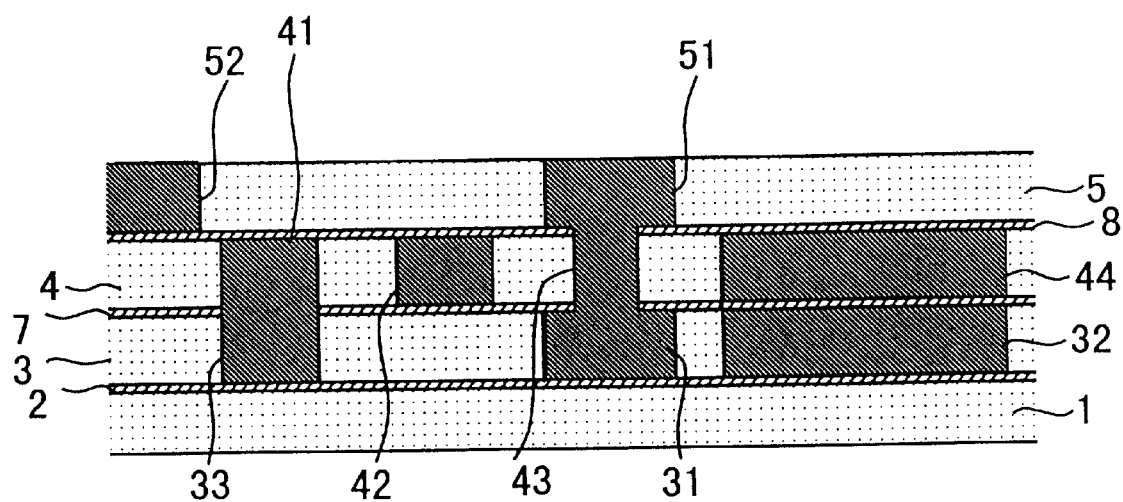

Then, openings are formed in the fourth interlayer insulating film 5 and in the third dielectric film 8 by anisotropic etching, and a metal film is buried in the etched area of the fourth interlayer insulating film 5 to form metal films 51 and 52 as shown in FIG. 9.

Thereafter, a fourth dielectric film 9 is formed on the fourth interlayer insulating film 5 including metal films 51 and 52, and the fifth $SiO_2$-based film 6 is deposited on the fourth dielectric film 9 as shown in FIG. 1.

According to the manufacturing method of this embodiment, a plurality of metal films can be buried in a same interlayer insulating film. This means that plugs, interconnections, electrodes of capacity elements, or the like can be formed in a same one interlayer insulating film. Therefore, an increased number of interconnections can be formed by fewer process steps.

For further reference, a method of manufacturing a semiconductor device having a multi-layer interconnection structure, according to the present invention may be summarized as follows.

According to one aspect, the method comprises the steps of: forming a first interlayer insulating film on a semiconductor substrate; forming a first dielectric film on the first interlayer insulating film; forming a second interlayer insulating film on the first dielectric film; forming a first conductive lead in said second interlayer insulating film by using a damascene process; forming a second dielectric film on said second interlayer insulating film and first conductive lead; forming a third interlayer insulating film on the second dielectric film; etching a predetermined portion of the third interlayer insulating film by anisotropic etching; etching another predetermined portion of the third interlayer insulating film and the second dielectric film above the first conductive lead by anisotropic etching; and burying a metal film in the etched portions of said third interlayer insulating film to form a second conductive lead and a conductive plug reaching the first conductive lead in the third interlayer insulating film.

According to another aspect, the method comprises the steps of: forming a first interlayer insulating film on a semiconductor substrate; forming a first dielectric film on the first interlayer insulating film; forming a second interlayer insulating film on the first dielectric film; forming a first conductive lead in said second interlayer insulating film by using a damascene process; forming a second dielectric film on said second interlayer insulating film and first conductive lead; forming a third interlayer insulating film on said second dielectric film; etching a predetermined portion of said third interlayer insulating film and said second dielectric film above the first conductive film by anisotropic etching; and burying a metal film in the etched area of said third interlayer insulating film reaching the first conductive lead to form a thick conductive lead.

According to still another aspect, the method comprises the steps of: forming a first interlayer insulating film on a semiconductor substrate; forming a first dielectric film on the first interlayer insulating film; forming a second interlayer insulating film on the first dielectric film; forming a first conductive lead in said second interlayer insulating film by using a damascene process; forming a second dielectric film on said second interlayer insulating film and first conductive lead; forming a third interlayer insulating film on the second dielectric film; etching a predetermined portion of the third interlayer insulating film above the first conductive lead by anisotropic etching; and burying a metal film in the etched portion of said third interlayer insulating film to form a second conductive lead in the third interlayer insulating film, thereby to form a capacitor element between the first conducive lead and the second conductive lead.

The effects and advantages of the present invention as described above may be summarized as follows.

According to one aspect of the present invention, in a semiconductor device, metal films for interconnections or conductive leads and plugs for connecting the interconnections in a different interlayer insulating films may be formed in one same interlayer insulating film. Therefore, the thickness of the entire interconnection device portion can be made thinner than that of a conventional device having the same number of interconnections. Further, the warp of wafers can be minimized, and erroneous sucking of wafers during wafer processing and defocusing during photoengraving are minimized.

In another aspect, in a semiconductor device, metal films are formed in specified corresponding locations of adjacent interlayer insulating films and joined together to form a thick metal film. Therefore, a thick interconnection is formed by linking the metal films of the neighboring interlayer insulating films, and the area occupied by interconnections can be reduced.

In another aspect, in a semiconductor device, a dielectric film is formed between neighboring interlayer insulating films, and the material for the dielectric film is selected to have etching selectivity against the interlayer insulating films. Metal films are formed in respective interlayer insulating films to sandwich the dielectric film to form a capacity element. Thus, the voltage dependency of the capacity element can be eliminated.

Still in another aspect, in a the method of manufacturing a semiconductor device, metal films of different form or different kind are buried in a plurality of interlayer insulating films by a damascene process, so that an increased number of interconnections can be formed in fewer process steps.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-197904, filed on Jul. 12, 1999 including specification, claims, drawings and summary, on which the Convention priority of the present application is based, are incorporated herein by reference in its entirety.

What is claimed is:

1. A semiconductor device having a multi-layer interconnection structure, said semiconductor device comprising:
   a semiconductor substrate;
   a plurality of interlayer insulating films formed on the semiconductor substrate;
   a dielectric film formed between at least one pair of adjacent interlayer insulating films;
   a plurality of conductive leads formed in the interlayer insulating films; and
   at least one conductive plug formed in at least one of the interlayer insulating films having at least one conductive lead, said conductive plug connecting at least a pair of conductive leads in the different interlayer insulating films, wherein conductive leads are formed in each interlayer insulating film of said at least one pair to form a capacity element.

2. The semiconductor device having a multi-layer interconnection structure according to claim 1, further comprising:

a dielectric film formed between the adjacent interlayer insulating films, the dielectric film having an etching selectivity against the interlayer insulating films.

3. A semiconductor device having a multi-layer interconnection structure, said semiconductor device comprising:

a semiconductor substrate;

a plurality of interlayer insulating films formed on the semiconductor substrate;

a dielectric film formed between at least one pair of adjacent interlayer insulating films;

a plurality of conductive leads formed in the interlayer insulating films; and wherein at least a pair of adjacent conductive leads, respectively formed in adjacent interlayer insulating films, are connected together to form a unified thick conductive film, and wherein conductive leads are formed in each interlayer insulating film of said at least one pair to form a capacity element.

4. The semiconductor device having a multi-layer interconnection structure according to claim 3, further comprising:

a dielectric film formed between the adjacent interlayer insulating films, the dielectric film having an etching selectivity against the interlayer insulating films.

5. A semiconductor device having a multi-layer interconnection structure, said semiconductor device comprising:

a semiconductor substrate;

a plurality of interlayer insulating films formed on the semiconductor substrate;

at least a dielectric film formed between the adjacent interlayer insulating films;

a plurality of conductive leads formed in the interlayer insulating films; and at least a pair of conductive leads formed in the interlayer insulating films adjacent to the dielectric film; said pair of conductive leads being formed at opposite positions to form a capacity element.

6. The semiconductor device having a multi-layer interconnection structure according to claim 5, wherein the conductive leads are formed from metal.

* * * * *